United States Patent
Bedarida et al.

(10) Patent No.: US 6,804,148 B2
(45) Date of Patent: Oct. 12, 2004

(54) FLASH MEMORY ARCHITECTURE WITH PAGE MODE ERASE USING NMOS AND PMOS ROW DECODING SCHEME

(75) Inventors: Lorenzo Bedarida, Vimercate (IT); Simone Bartoli, Carbiago (IT); Fabio T Caser, Milan (IT); Sabina Mognoni, Monza (IT)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 10/352,734

(22) Filed: Jan. 27, 2003

(65) Prior Publication Data

US 2004/0076037 A1 Apr. 22, 2004

(30) Foreign Application Priority Data

Oct. 22, 2002 (IT) ..................................... MI2002A2240

(51) Int. Cl.[7] .............................................. G11C 16/04
(52) U.S. Cl. ........................... 365/185.13; 365/185.23; 365/185.33
(58) Field of Search ....................... 365/185.13, 185.23, 365/185.33, 185.18, 189.11, 230.06

(56) References Cited

U.S. PATENT DOCUMENTS

| | | | |
|---|---|---|---|
| 5,903,497 A | 5/1999 | Yu et al. ................ | 365/185.22 |
| 5,999,451 A | 12/1999 | Lin et al. ................ | 365/185.11 |
| 6,222,775 B1 | 4/2001 | Cappelletti ............. | 365/185.29 |
| 6,262,926 B1 | 7/2001 | Nakai ......................... | 365/200 |
| 6,282,122 B1 | 8/2001 | Sansbury ............... | 365/185.24 |
| 6,359,810 B1 | 3/2002 | Gupta et al. ........... | 365/185.29 |
| 6,456,527 B1 | 9/2002 | Campardo et al. .......... | 365/185 |
| 6,587,375 B2 * | 7/2003 | Chung et al. .......... | 365/185.13 |

* cited by examiner

*Primary Examiner*—David Lam
(74) *Attorney, Agent, or Firm*—Thomas Schneck; Mark Protsik (57) ABSTRACT

A flash memory with a page erase architecture using a local decoding scheme instead of the global decoding scheme known in the prior art. Under the local decoding scheme, the flash memory is partitioned into sections. Each section comprises a plurality of local decoder and local circuitry. The local circuitry comprises switches controlled by the global decoders and these switches switch only in erase operation and not read operation. The reading time is not affected. Each local decoder is coupled to each row of the memory array. Each local decoder comprises a PMOS transistor for passing negative voltages and two NMOS transistors for passing positive voltages so that a page erase is achieved and unselected rows can be protected from unwanted erasure without additional and complex circuitry. The global decoder is located outside of the sectors and provides global signals to all sectors via the local circuitry, thus saving area.

12 Claims, 11 Drawing Sheets

READ/PROGRAM OPERATION

FIG._3A

READ/PROGRAM OPERATION

FIG._3B

READ/PROGRAM OPERATION

FIG._3C

READ/PROGRAM OPERATION

ERASE VERIFY

FIG._5A

ERASE VERIFY

FIG._5B

ERASE VERIFY

FIG._5C

ERASE VERIFY

FLASH MEMORY ARCHITECTURE WITH PAGE MODE ERASE USING NMOS AND PMOS ROW DECODING SCHEME

TECHNICAL FIELD

The invention broadly relates to non-volatile memory devices, such as flash memories. More particularly, the invention relates to memory devices using a page mode for erase operations, also known as "page erase", and specifically to the decoding scheme for such operations.

BACKGROUND ART

Figure 1A:
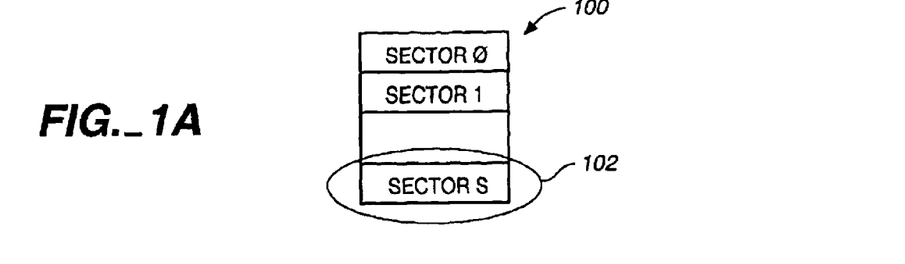
FIG. 1A is a diagram illustrating a flash memory array that is partitioned into S sectors.
Figure 1B:
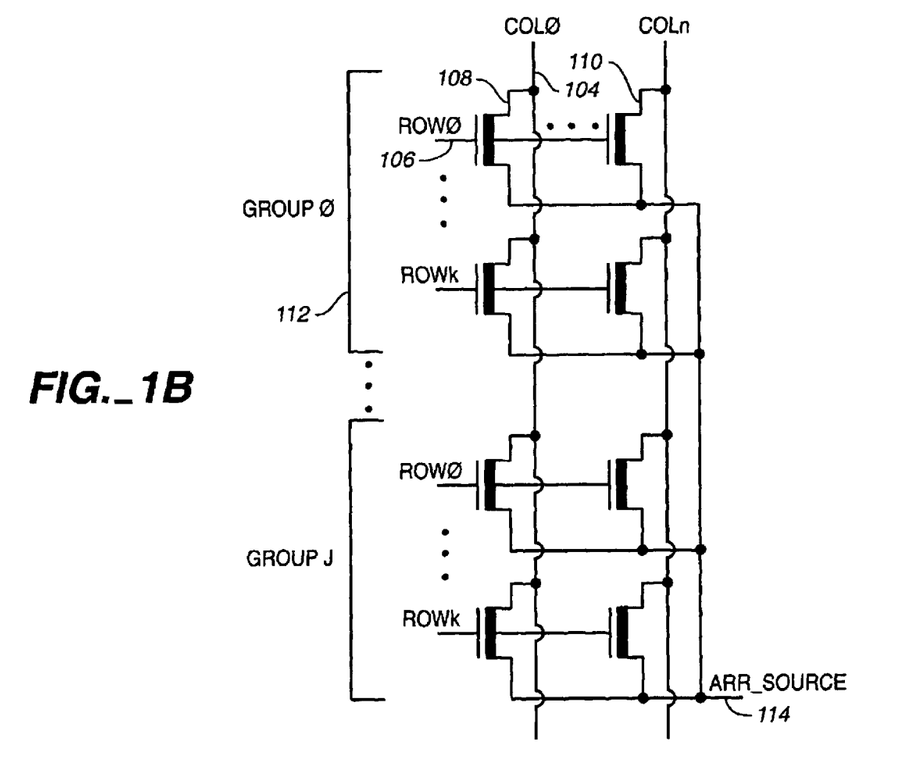
FIG. 1B illustrates a sector in FIG. 1A that is further partitioned into J groups and each group is further partitioned into K rows and each memory cell in a row is a floating gate transistor.

In the FIG. 1A, the flash memory 100 is partitioned into S sectors 102, ranging from sector 0 to sector S. In FIG. 1B, the details of the sector 102 are shown. Each sector 102 further partitioned into J groups, from group 0 to group J. Within each group 112, there are K rows (or "pages"), ranging from row 0 to row K. A row 106 has N memory cells, ranging from cell 0 to N. The first memory cell in a row 106 belongs to column 0 and memory cell N belongs column N respectively. Therefore, there are N+1 columns in the memory array 100. The gates of all the cells within a row 106 are coupled together to form a wordline. The sources of the cells in each row are coupled together and coupled to those of other rows, forming an array source 114. The drains of the cells in each row are coupled together to form a bitline. The NOR flash array 100 allow users to electrically program and erase information stored in a memory cell 108.

Each memory cell 108 in the flash memory matrix 100 is a floating gate transistor. The structure of a floating gate transistor is similar to a traditional MOS device, except that an extra poly-silicon strip is inserted between the gate and the channel. This strip is not connected to anything and called a floating gate. The threshold voltage of a floating gate transistor is programmable. Flash programming occurs when electrons are placed in the floating gate. Programming occurs when a high voltage is applied between the source and gate-drain terminals such that a high electric field causes avalanche injection to occur. Electrons acquire sufficient energy to traverse through the first oxide insulator, so they are trapped on the floating gate. The charge is stored on the floating gate. Flash programming is done on bit-by-bit basis by applying a correct voltage at the bitline 104 of each cell 108.

The floating layer allows the cell 108 to be electrically erased through the gate. Erase operations can be done on more than one cell at a time. Generally, erase is simultaneously done on either the entire flash memory array or an array sector. The erase operation of the entire array is called chip erase, and that of an array sector is a sector erase. Furthermore, erase operations can be performed on a single row in a sector. This is known as page erase.

Figure 1C:
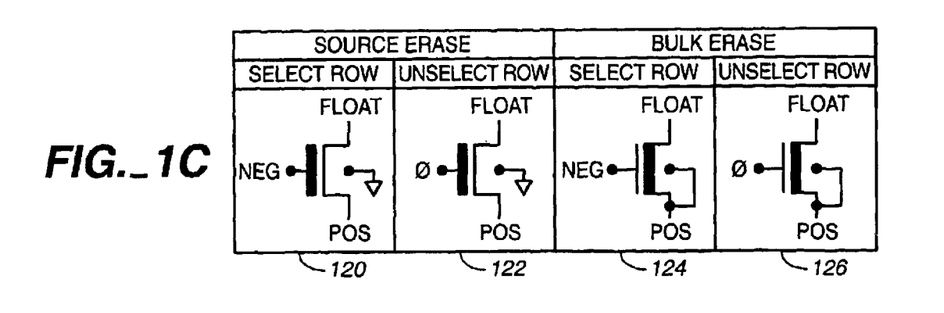
FIG. 1C illustrates memory cell arrangements for source erase and bulk erase for a floating gate transistor of the kind shown in FIG. 1B.

Referring to FIG. 1C, each memory cell 108 in a row 106 can be set to perform either a source erase or a bulk erase. In a source erase, as in blocks 120 and 122, whenever a row is selected, as in the block 120, the substrate is grounded, the drain is floating, and the source is connected to a positive voltage. The gate is made negative so that electrons are expelled from the floating layer. To avoid an unwanted erase on neighboring rows, unselected rows in block 122 have a ground voltage applied to the gate; the drain is floating; the substrate is grounded and the source is positive. When a row is selected to be erased, a positive voltage is applied at the array source 114; all N columns 104 are allowed to float; the gates of the selected row is made negative and the gates of the unselected rows are applied ground voltage.

For bulk erase, exemplified in blocks 124 and 126, the same voltages as in the source erase blocks 120 and 122 are applied to the memory cell 108, but the only difference is that the source is coupled to the substrate and a positive voltage is applied there.

In either source erase or bulk erase, both addresses of the selected and unselected rows have to be specified. Therefore, large row and column decoders are needed and less memory area is dedicated to memory cells.

The U.S. Pat. No. 6,359,810 entitled "Page Mode Erase in a Flash Memory" to Anil Gupta and Steven Schumann (the '810 patent) discloses page erase and multiple page erase modes in a flash memory array to reduce unwanted erasure. In the '810 patent, a preferred tunneling potential of approximately −10 volts is applied to the gates of the flash memory cells on the row or rows being selected for erasure, and the bitlines connected to the drains of the flash memory cells are driven to a preferred voltage of approximately 6.5 volts. To reduce the unintended erasure of memory cells in rows other than the selected row or rows, a preferred bias of approximately 1 to 2 volts is applied to the gates of all the flash memory cells in the unselected rows. The '810 patent uses n-channel MOS transistors as row decoders, and p-channel MOS transistors as pass isolation transistors to isolate unselected rows in other groups from unwanted erasure. The '810 patent selects a particular row in a group by applying a VCC voltage to that row and zero voltage to other unselected rows in the groups. Other rows in the group are unselected by applying a zero voltage to the drain. Other groups are unselected by applying positive voltage to the p-type channel transistors.

An object of the present invention is to provide page erase operation in a flash memory with protection against unwanted erasure in unselected rows and at the same time does not affect the read access time.

Another object of the present invention is to provide an array architecture with page erase, block erase, and sector erase with minimum die area.

Therefore, it is an object of the invention to optimize the read access time, to optimize the area density of the flash memory 100 dedicated to memory cells, and to provide an ability for the memory to protect unselected cells from unwanted erasure without adding more circuitry.

SUMMARY OF THE INVENTION

The above objects are achieved by means of a memory array arranged in rows and columns which are partitioned into a plurality of sectors. Each sector comprises a plurality of groups and each group further comprises a plurality of rows. The row decoder of the memory array is partitioned into local decoders and a global decoder. The local decoders are located in the array sectors and each coupled to each row of the sector for passing a voltage corresponding to a specific operation to each row. Each local decoder further comprises at least one NMOS transistor for passing negative voltage to the row of memory array and a PMOS transistor for passing a positive voltage to the row of the memory array. Each sector of the memory array also comprises local circuitry coupled to the plurality of local decoders for passing the correct voltage thereto. The local circuitry and local decoders, controlled by a global decoder, are only switched during erase operations but not during read operations. Therefore, this arrangement does not affect the reading time. The global decoder is coupled to the local circuitry for passing specific voltages thereto. Because the global decoder is shared by the whole array matrix, more area is saved for memory cells.

In another embodiment, the present invention provides a method for using local decoding scheme with local circuitry and a global decoder to carry out page erase mode in a memory array.

DETAILED DESCRIPTION OF THE PREFERRED EMBODIMENT

Figure 2:
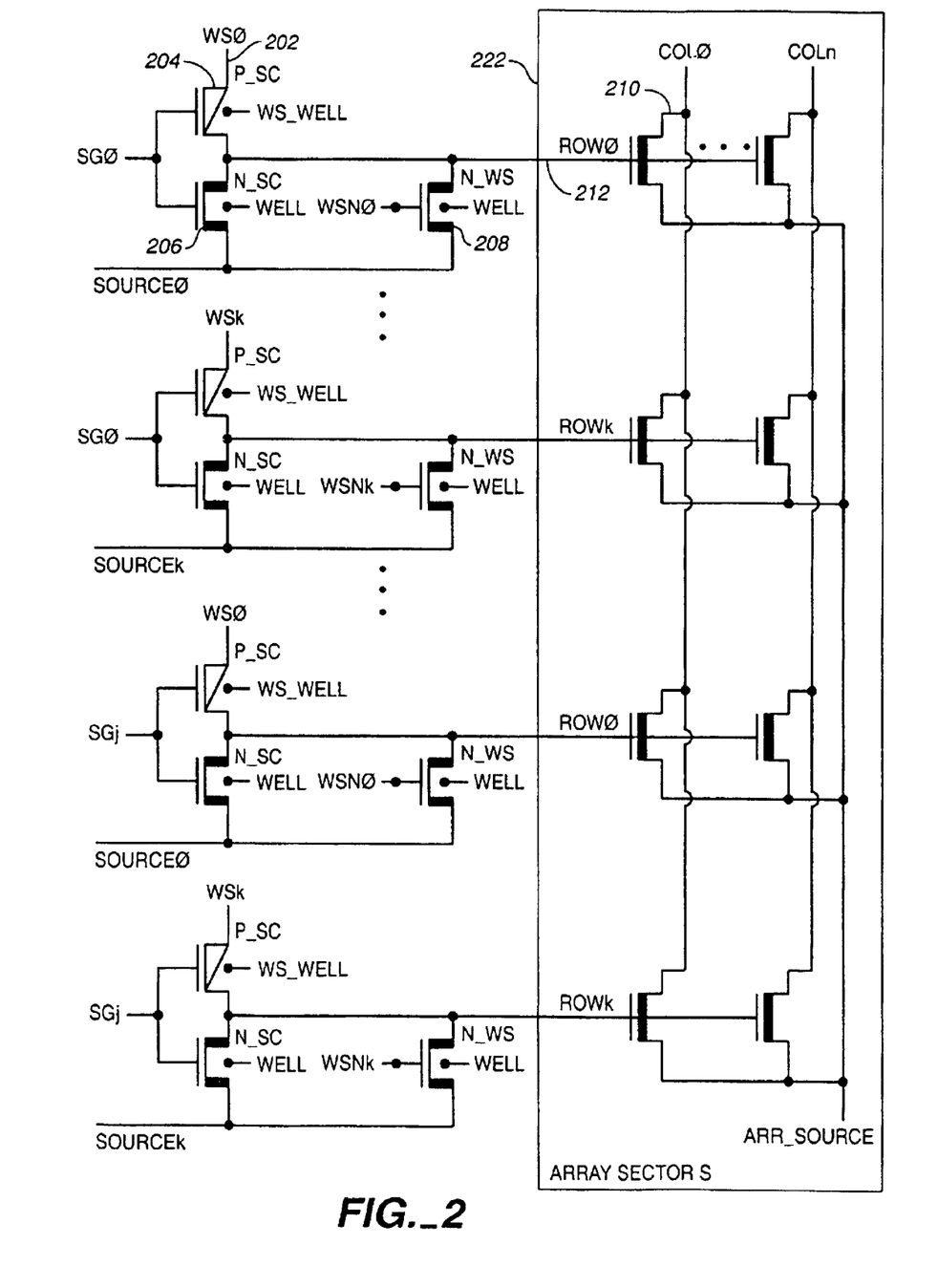
FIG. 2 illustrates a schematic diagram of row decoders coupled to a sector of a flash memory array illustrated in FIGS. 1A, 1B, and 1C.

With reference to FIG. 2, the structure of a memory array with the local decoders is seen. A second NMOS transistor in the local decoder enables a user to bias the remainder (K−1) of unselected rows of the selected group, at ground during read/program operations or at negative voltage during an erase verify operation, without further circuitry.

A plurality of local decoders 202, are each coupled to the row 212 of a sector S. Each local decoder 202 comprises at least one n-type MOS (NMOS) transistor to pass negative voltage and at least one p-type MOS (PMOS) transistor to pass positive voltage to the row 212. In a preferred embodiment, the plurality of local decoders 202 each comprises a PMOS transistor 204 coupled in series with a first NMOS transistor 206, and a second NMOS transistor 208 coupled in parallel with the first NMOS transistor. The gate of the PMOS transistor 204 is coupled to the gate of the first NMOS transistor 206 to form the select gate terminal (SGj) of the local decoder 202. The drain of the PMOS transistor 204 is coupled to the WSj terminal 202. The source of the PMOS transistor 204 is coupled to the drain of the first NMOS transistor 206 and the second NMOS transistor 208 and to the row 212 of the array sector. The sources of the first and second NMOS transistors 206 and 208 are coupled together to form a SOURCEk terminal. The gate of the second NMOS transistor 208 is coupled to the WSNj terminal. Each output of the local decoder is coupled to the row 212 of the sector 222. The second NMOS transistor 208 allows the local decoder 202 to bias (K−1) other rows of the selected group at ground during read/program operations or at negative voltage during an erase verify operation.

With reference to FIGS. 3A–3D through FIGS. 5A–5D, different voltages are seen to be applied to the local decoders to achieve the correct voltages on the wordlines for carrying out three different operations, such as "read", "page erase", or "erase verify" operations. There are four situations for each operation. The first situation, situation A, is for the selected wordline. The other situations, B, C, and D, are for the unselected rows, groups, and sectors. In particular, situation A is related to a wordline selected for the operation, so in situation A both the row and group in the local decoder are selected. Situation B is related to all the local decoders in the sector having the row (WS terminal) selected but group (SG terminal) unselected. Situation C is related to the (K−1) local decoders in which the group is selected but the row is unselected. For wordlines of situation C, the correct biasing during read and erase verify operations is achieved using the second NMOS transistor 208, as previously described, in the row decoder according to the present invention. Situation D is related either to local decoders in which both row and group are unselected or to local decoders in unselected sectors. For any of the three operations above, namely read, page erase and erase verify, a single specific row in a specific group is selected. All other wordlines are unselected, since either the group is unselected, or the row is unselected, or both.

Referring to FIG. 3, there are four situations for each read/program operation. For the read/program operation, the first situation, shown in FIG. 3A, is when both a specific row of a memory array and the group containing that row are selected. In this case, a specific row in a specific group is selected. A set of voltages are applied to the local decoder 300A so that the positive voltage is applied to the selected row. More particularly, the ground voltage is applied to the gates of PMOS transistor 302A and NMOS transistor 304, and the source of NMOS transistor 304A, and the positive voltage is applied to the drain of PMOS transistor 302A of the local decoders 300A. The ground voltage is applied to the substrates of both NMOS transistors 304A and 306A. The positive voltage is applied to the substrates of the PMOS transistor 302A of the local decoder 300A. The ground voltage is applied to the gates of the first NMOS transistors 204A and second NMOS transistor 306A, so that these transistors are OFF and the PMOS transistor 302A is ON. Therefore, the output of the local decoders associated with the selected row and group is the positive voltage. A positive voltage on the output of the local decoder allows a read/program operation is to take place for that row.

Figure 3A:
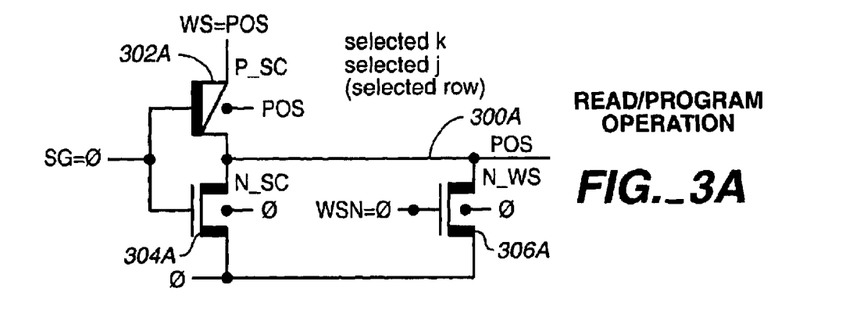
FIGS. 3A–3D illustrate memory cell arrangements for realizing a read/programming operation for a local decoder illustrated in FIG. 2.
Figure 3B:
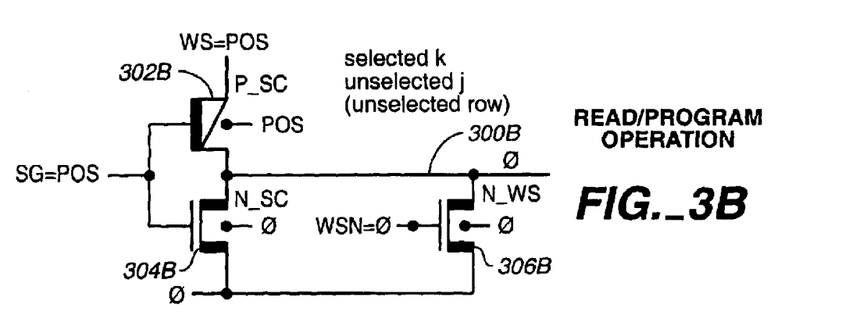

The second situation is shown in FIG. 3B when the particular row is selected and the group is not selected. All rows belonging to this situation are unselected so that a ground voltage is applied to those wordlines. When this happens, the positive voltage is applied to the gates of the transistor 302B and 304B of the local decoders 300B. The ground voltage is applied to the substrates of both NMOS transistors 304B and 306B and the positive voltage to the bulk of the PMOS transistor 302B. The positive voltage is applied to the gate of the first NMOS transistor 304B so that the output of the local decoders is the ground voltage because the PMOS transistor 302B is OFF, the second NMOS transistor 306B is OFF, and the first NMOS transistor 304B is ON, pulling down the local decoder 300B to ground. A ground voltage on the output of the local decoder means that the row is not selected for read/program operation.

Figure 3C:
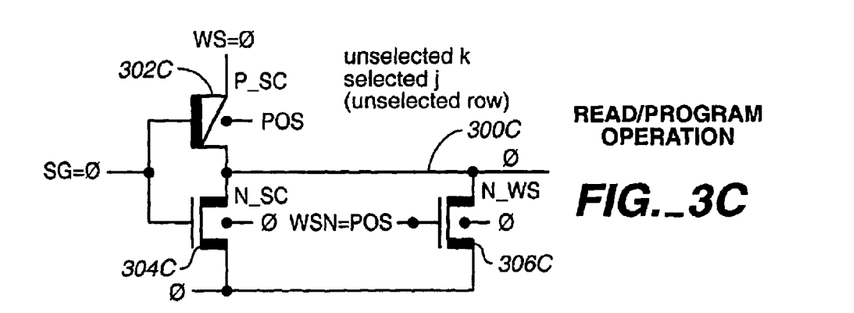

Referring to FIG. 3C, when a group is selected and the rows are not selected, then the wordlines coupled to those local decoders are not selected for the read/program operation. The ground voltage is applied to the gate and the source of transistor 304C and to the gate and the drain of transistor 302C. The ground voltage is also applied to the bulks of both NMOS transistors 304C and 306C and the positive voltage to the bulk of the PMOS transistor 302C. The positive voltage is applied to the gate of the second NMOS transistor 306C so that the output of the local decoders associated with the selected row is pulled low to ground voltage.

Figure 3D:
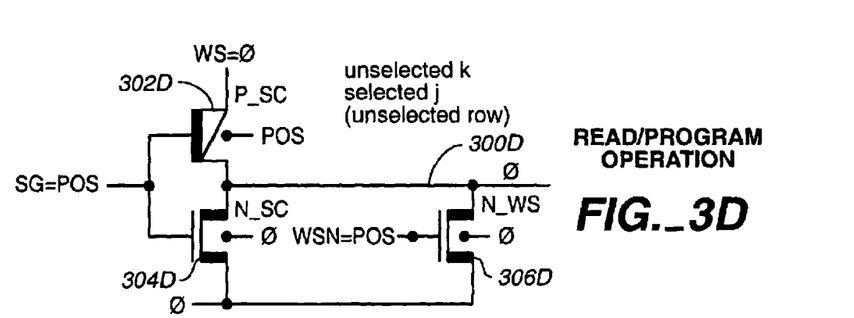

Referring to FIG. 3D, when the groups and the rows are unselected then the wordlines coupled to these local decoders are not selected for the read/program operation. The positive voltage is applied to the gate, while the ground voltage is applied to the source and the drain of the local decoders 300D associated with unselected rows. The ground voltage is also applied to the substrate of both the NMOS transistors 304D and 306D and the positive voltage to the PMOS transistor 302D. The positive voltage is applied to the gate of the second NMOS transistor 306D and the output of the local decoders is pulled to ground voltage by both of the NMOS transistors 304D and 306D of the local decoder.

FIG. 4 illustrates conditions for a page erase operation to be carried out. Similar to the read/programming operation above, the first situation is for selected rows and groups, while the last three situations are for prevention of unwanted erasure in the unselected rows, groups, and sectors. Page erase means that only one row is based at negative voltage and all other rows in the sector are grounded. Block erase means a number of rows being erased. Sector-erase means all rows in the selected sector are negative during the erase pulse.

Figure 4A:
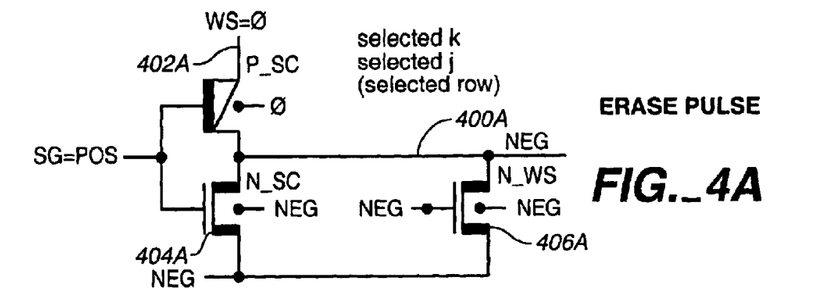
FIGS. 4A–4D illustrate memory cell arrangements for carrying out a page erase for a local decoder illustrated in FIG. 2.

Referring to FIG. 4A, when a row is selected and a group is selected, then a specific row in a specific group is selected, e.g. the 5$^{th}$ row of group 10, is selected. The positive voltage is applied to the gate of transistors 402A and 404A while the ground voltage is applied to the drain of transistor 402A, and negative voltage to the source of transistor 404A of the local decoders 400A. The negative voltage is applied to the substrates of both NMOS transistors 404A and 406A. The ground voltage is applied to the substrates of the PMOS transistor 402A. The negative voltage is applied to the second NMOS transistor 406A. The output of the local decoder 400A associated with the selected row is pulled to a negative voltage. This situation is applicable to erase a specific row or page erase.

Figure 4B:
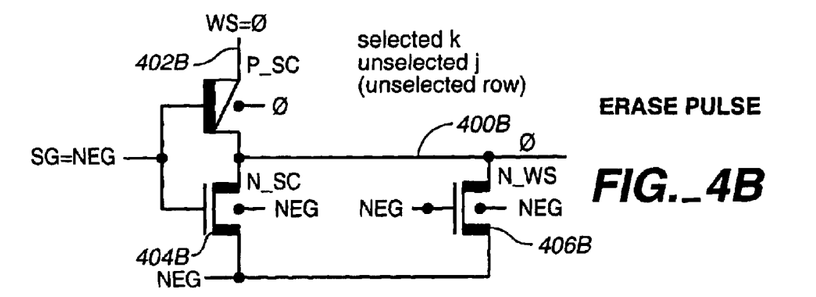

Referring to FIG. 4B, when a row is selected and a group is unselected then every specific row in any group is prevented from unwanted erasure, e.g., in the example above row number 5 in every unselected group are selected. Therefore, there are 9 rows selected. The negative voltage is applied to the gate and the source of the transistor 404B while the ground voltage is applied to the drain of transistor 402A of the local decoder 400B. The negative voltage is applied to the bulks of both NMOS transistors 404B and 406B, while the ground voltage is applied to the bulk of the PMOS transistor 402B. The negative voltage is applied to the second NMOS transistor 406B so that the output of the local decoder 400B associated with the selected row is at ground voltage. The ground voltage on the output of the local decoder indicate that no erase operation is taking place on that row.

Figure 4C:
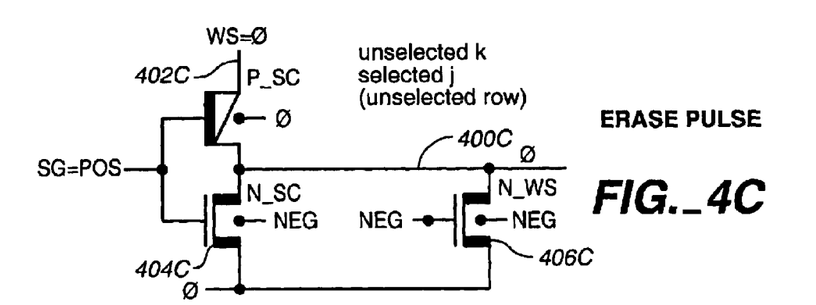

Referring to FIG. 4C, when a group is selected and a row is not selected, then that row is not erased. The positive voltage is applied to the gate of transistor 402C and 404C, while the ground voltage is applied to the drain of the transistor 402C, and the source of transistor 404C of the local decoder 400C. The ground voltage is applied to the substrate of the PMOS transistor 402C and the negative voltage is applied to the substrates of both NMOS transistors 404C and 406C. The negative voltage is applied to the gate of the second NMOS transistor. The output of the local decoder 400C is the ground voltage. This situation is applicable to prevent unwanted erasure in the neighbor rows of the selected group.

Figure 4D:
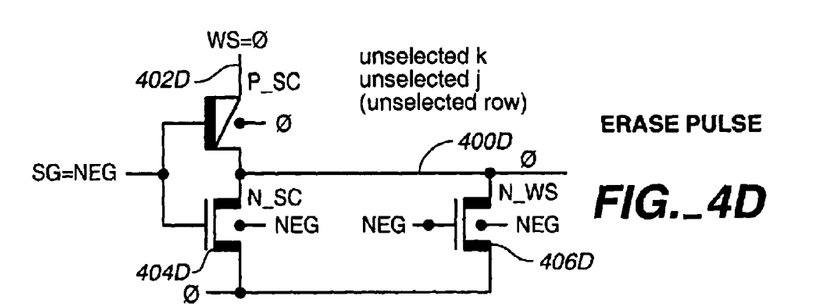

Referring FIG. 4D, when a group and a row are unselected, then those rows are not erased. The negative voltage is applied to the gate of transistors 402D and 404D, while the ground voltage is applied to the drain of transistor 402D and the source of transistor 404D of the local decoder 400D. The negative voltage is applied to the substrates of the NMOS transistors 404D and 406D and the ground voltage is applied to the substrate of the PMOS transistor 402D. The negative voltage to the gate of the second NMOS transistor 406D. The output of the local decoder 400D is pulled to ground voltage.

With the structure shown in FIG. 2, it is possible to have a wordline at a positive voltage and all other rows in the sector at a negative voltage. This structure allows erase verify without any additional circuitry. FIG. 5 illustrates the conditions applied to the local decoder to provide the correct erase verify voltage to the row of the sector.

Figure 5A:
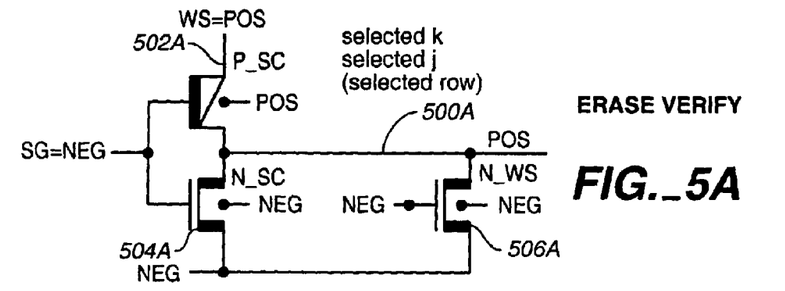
FIGS. 5A–5D illustrate memory cell arrangements for carrying out an erase verify for a local decoder illustrated in FIG. 2.

Referring to FIG. 5A, when the instruction is "erase verify", then the set of voltages applied to the local decoder includes: whenever the row is selected and a group is selected, then the negative voltage is applied to the gate and the source, while the positive voltage is applied to the drain of the local decoder 500A. The negative voltage is applied to the substrates of both NMOS transistors 504A and 506A and positive voltage is applied to the substrate of the PMOS transistor 502A. The negative voltage is applied to the second NMOS transistor 506A. The output of the local decoder 500A associated with the selected row is the positive voltage. The positive output indicates that an erase verify operation is being carried out for that row. This situation is applicable when a specific row in a specific group is selected for erase verify.

Figure 5B:
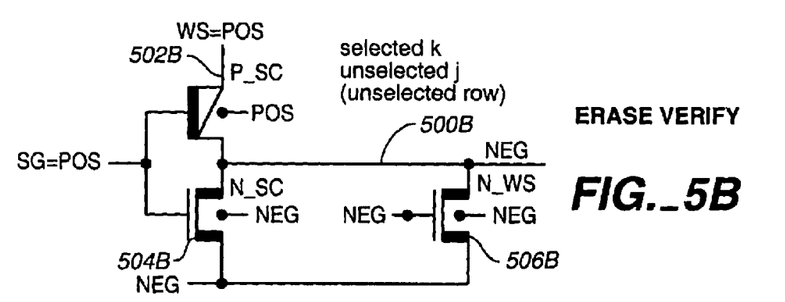

Referring to FIG. 5B, when a row is selected and a group is not selected. Positive voltage is applied to the gate and drain, the negative voltage to the source of the local decoder 500B. The negative voltage voltage is applied to the substrates of the NMOS transistors 504B and 506B and the positive voltage is applied to the substrate of the PMOS transistor 502B. The negative voltage is applied to the gate of second NMOS transistor 506B. The output of the local decoder 500B associated with the selected row is the negative voltage, which indicates that no erase verify operation is taking place in that row.

Figure 5C:
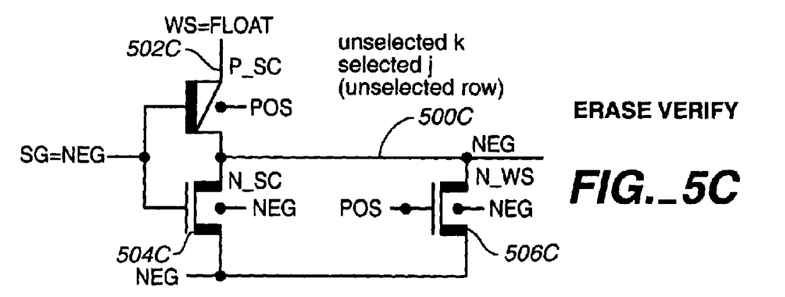

Referring to FIG. 5C, when a group is selected and a row is not selected, then that row is not selected for erase verify. Negative voltage is applied to the gate, the source, leaving the drain of the decoder 500C floating. The negative voltage is applied to the substrates of the NMOS transistors 504C and 506C and the positive voltage is applied to the substrate of the PMOS transistors 502C. The positive voltage is applied to the gate of the second NMOS transistor 506C so that the output of the local decoder 500C is the negative voltage.

Figure 5D:
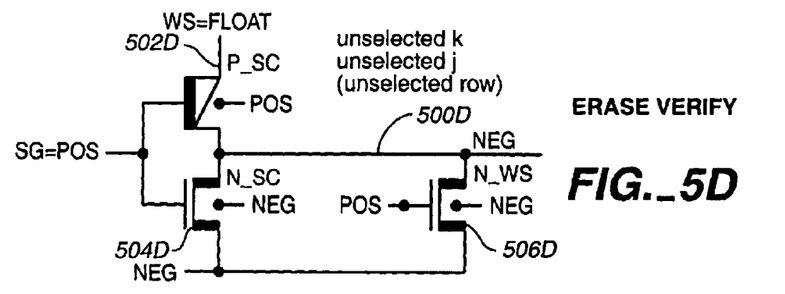

Referring to FIG. 5D, when a group and a row are unselected then those rows are not selected for erase verify. The positive voltage is applied to the gate, negative voltage is applied to the source and the leaving the drain of the local decoder 500D floating. The negative voltage is applied to the substrate of NMOS transistors 504D and 506D and the positive voltage to the PMOS transistor 502D The positive voltage is applied to the gate of the second NMOS transistor so that the output of the local decoder is the negative voltage.

As illustrated in FIGS. 3A–3D through 5A–5D above, the gate of the PMOS and NMOS row decoders and the source of the local decoder can be biased in a selected way. The source of the local decoder is always zero in the read/program situation. Therefore, the read access time does not suffer a penalty due to the arrangement between global and local decoders in the present invention. In addition, four situations above allow the flash memory to perform page, block, and sector erase.

Figure 6A:
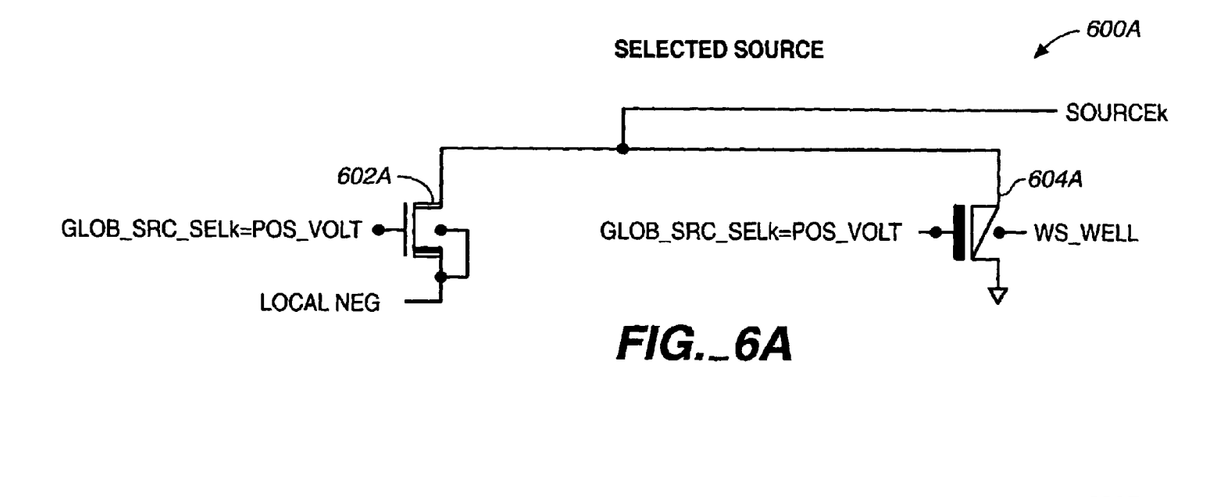
FIGS. 6A–6B illustrate a source selector that provides negative or ground voltage to the source of a local decoder illustrated in FIG. 2.

Referring to FIG. 6A, a source selector 600A is a local circuit, coupled to each source in a local decoder at the terminal SOURCEk as shown in FIG. 2 to provide the correct local source voltage. The selectability of the source voltage is an important feature for page erase, described above with reference to FIG. 4, because it allows a specific row to be erased. Each source selector 600 comprises a NMOS transistor 602 coupled in parallel with a PMOS transistor 604. The drains are coupled together and to the SOURCEk terminal of a local decoder described above in FIG. 2. The gate of the NMOS transistor 602 and the gate of the PMOS transistor 604 each is coupled to a GLOB_SRC_SELk terminal as described above in FIG. 8A. The substrate of the NMOS transistor is coupled to the source and to a local negative voltage (LOCAL NEG). The source of the PMOS transistor 604 is grounded, while the substrate is coupled to a WS_WELL (positive or ground voltage).

Figure 6B:
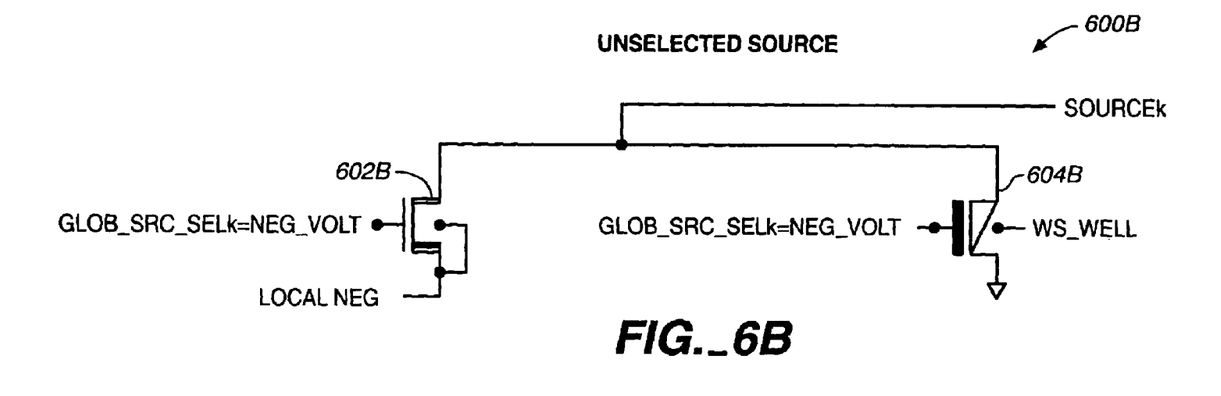

FIG. 6A is an example of a situation when the GLOB_SRC_SELk is the positive voltage so that the SOURCEk is a negative voltage because the PMOS transistor 604A is cutoff and the NMOS transistor 602A is ON, connecting the local negative to the SOURCEk. On the other hand, FIG. 6B exemplifies to an opposite situation when the global GLOB_SRC_SELk is negative so that the transistor 604B is cutoff and the PMOS transistor 604B is ON, connecting the SOURCEk to ground. The GLOB_SRC_SELk only needs to switch between positive and negative voltages to select a specific row and protect the (K–1) unselected rows from unwanted actions (FIGS. 4C–4D). The global source selector (GLOB_SRC_SELk) must be either positive or negative bias in order to control the local decoder. The GLOB_SRC_SELk can be generated once in the device for all sectors, thus globally saving area.

Figure 7:
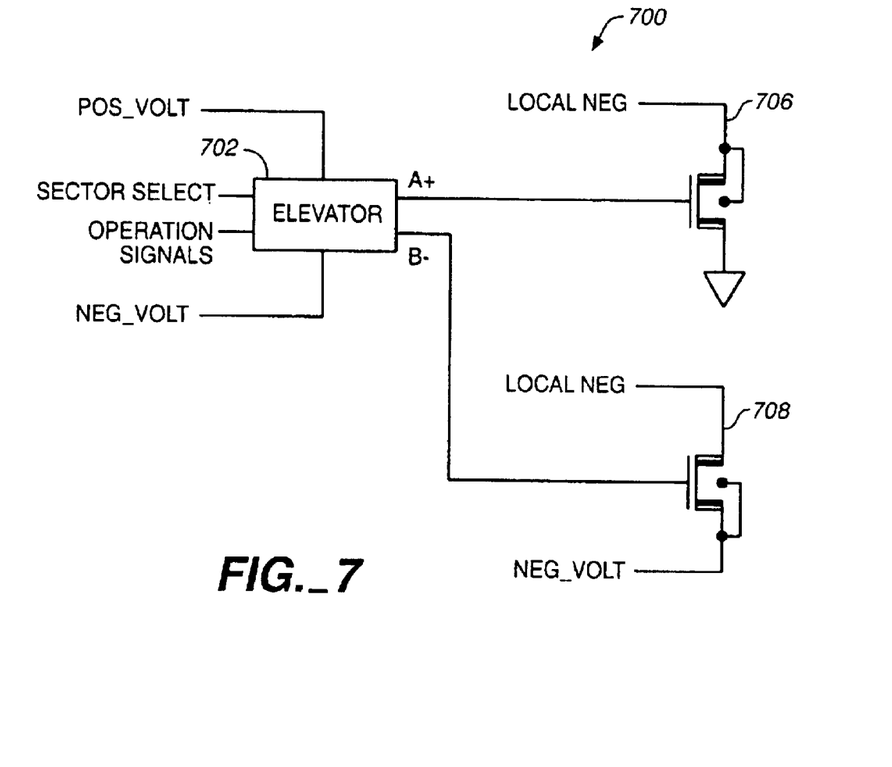
FIG. 7 is a schematic diagram of a sector switch connecting the local negative supply (LOCAL NEG) to the negative charge pump (NEG_VOLT) in the selected sector.

Referring to FIG. 7, in each sector, a sector switch 700 is part of the local circuitry and coupled to the local source selector for connecting the local negative supply (LOCAL NEG) to the negative charge pump (NEG_VOLT) in each sector. The sector switch 700 comprises an elevator 702 coupled to two NMOS transistors 706 and 708. The drain of the NMOS transistor 706 is coupled to the LOCAL NEG of the local switch, and the source is grounded, while the gate is coupled to a first output A of the elevator 702. Another output B of the elevator 702 is coupled to the gate of the transistor 708. The bulk of the transistor is coupled to the source and to the negative charge pump NEG-VOLT of the selected sector. The drain of the transistor 708 is coupled to the LOCAL NEG. The elevator 702 has two input terminals: the first input terminal is a sector selector (SECTOR_SELECT) and the second input terminal is an operation signals. The elevator 700 switches between positive and negative voltage. If SECTOR_SELECT and OPERATION_SIGNAL are high then the first output is at negative voltage and the second output is at positive voltage. In all other cases output A is at positive voltage and output B is negative (NEG_VOLT). When a sector is selected or SECTOR_SELECT is high and OPERATION SIGNAL is high, the first output A is negative and the second output B is at positive voltage so that the local negative voltage of the selected sector is coupled to the negative charge pump in the sector. When the OPERATION SIGNAL and/or sector select is switched to a ground voltage, the first output A is positive and the second output B is negative, thus connecting the LOCAL_NEG node to ground voltage. As a result there is no local negative voltage to provide for the source selector in FIG. 6 and the local decoder cannot erase because the local decoder needs negative voltage at its source to erase.

Figure 8A:
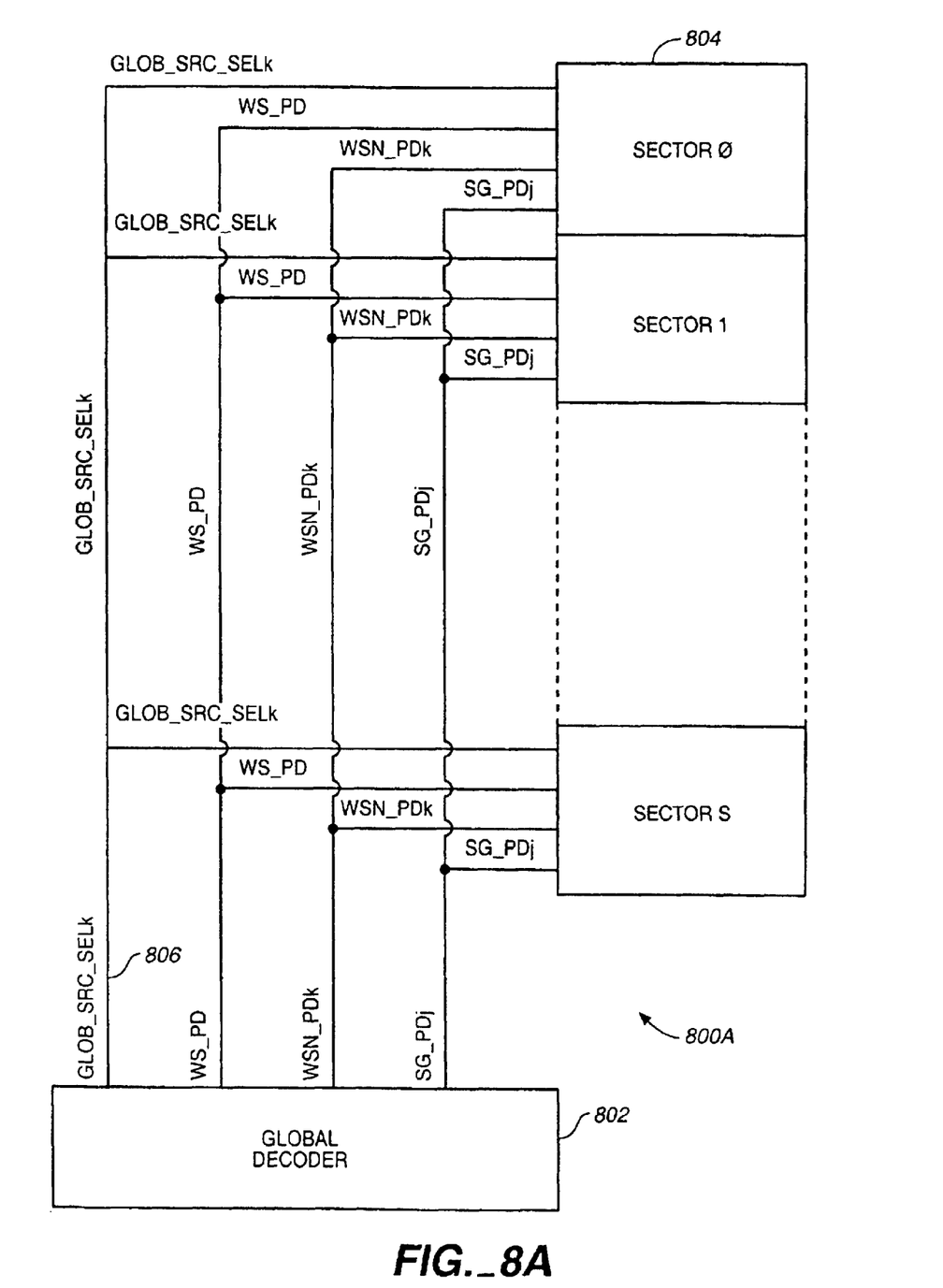
FIG. 8A is a block diagram of a flash memory coupled to a global decoder according to the present invention.

Referring to FIG. 8A, the architecture of the flash memory 800A using local and global decoding scheme is shown. The global decoder 802 is coupled each sector 804 and passes four groups of signals to each sector of the memory array 800A. The local decoders and associated local circuits are located inside each sector. The first one is GLOB_SERC_SELk, or the global row selector 806. As discussed before, the GLOB_SERC_SELk is coupled to the gates of the source selector 600 shown in FIG. 6A. As mentioned above, the GLOB_SERC_SELk is either a positive or negative voltage to provide local negative or ground voltages to the source of the local decoder. The second terminal coupled to the group of signals WS_PDj controls the generation of signals on the drain of the local decoder situated in each sector. The local circuitry will be discussed in detail later. The third terminal coupled to the group of signals WSN_PDk controls the generation of signals on the gate of the second NMOS transistor of the local decoder. The fourth terminal coupled to the group of signals SG_PDj controls the generation of signals on the gate of the local decoders. The global decoder 802 passes "read", "erase", or "erase verify" voltages to the local circuitry and informs local circuitry about which row to select and which rows to isolate according to the selected instruction.

Figure 8B:
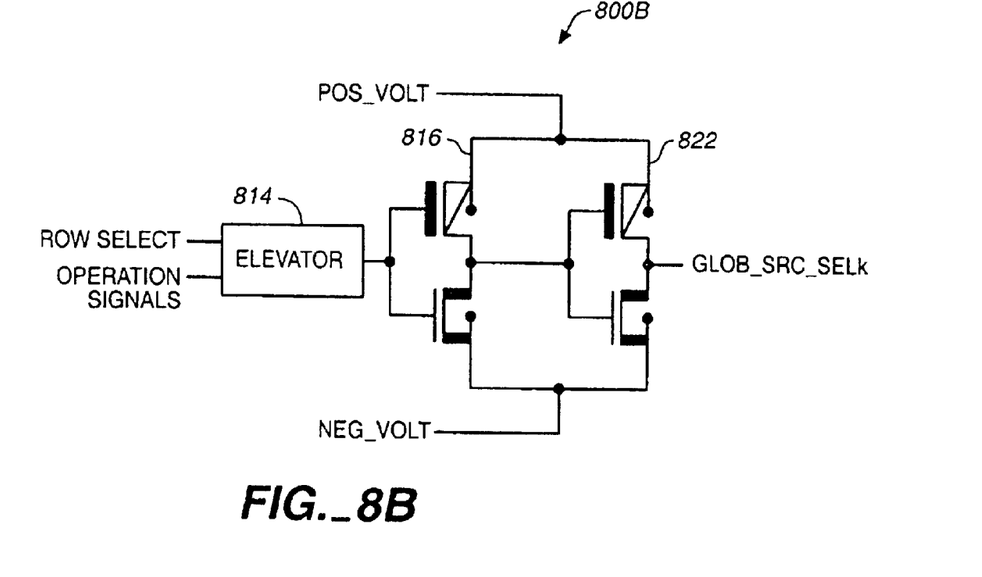
FIG. 8B is a schematic diagram of a source driver controller in a source erase operation for use with the apparatus of FIG. 8A.

Referring to FIG. 8B, a global switch 800B issues general global signals. These global signals control the local circuits that generate SOURCEk, SGj, WSK, and WSNk signals. The global switch comprises an elevator 814 with two input terminal row select and operation signals. The output of the elevator 814 is coupled to the input of a first inverter 816. The output of the first inverter 816 is coupled to the input of a second inverter 822. Both inverters are pulled up to positive voltages and pulled down to a negative. The output of the second inverter 822 is coupled to either GLOB_

SRC_SELk SG_PDj, WS-PD, WSN_PD. The elevator 814 switches between the pull-up positive voltage and the pull-down negative voltage. If row select and operation signal are high, the output is pulled to a negative voltage. In all other cases, the output is at a positive voltage. The GLOB-SRC-SELk is coupled to the gates of the NMOS channel transistors of the source selector shown in FIG. 6 and must be either positive or negative in order to control the driver source value. The value of the GLOB_SRC_SELk can be generated once in the device for all the sectors to reduce die size. The connections and functions of SG_PDj, WS_PDk, and WSN_PDk between the global switch 800B are the local circuitry are discussed below.

Figure 9A:
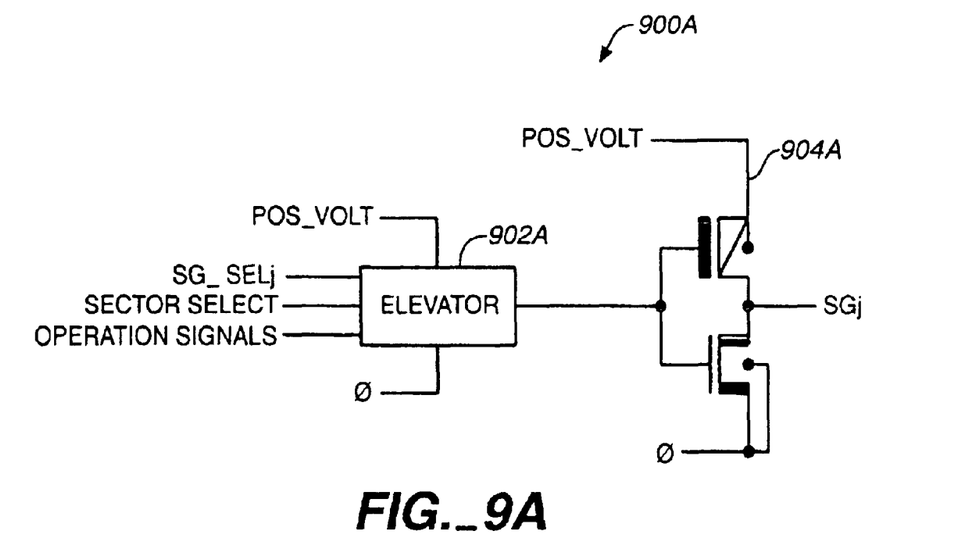
FIG. 9A is a schematic diagram of a driver switching circuit that selects a local decoder for use with the apparatus of FIG. 8A.

Referring to FIG. 9A, a driver switching circuit 900A comprises an elevator circuit 902A coupled to a CMOS inverter 904A. The elevator circuit 902A is driven between a positive and a ground voltage and has three input terminals SG_SELj, sector select and operation signals. The elevator 902A switches between the positive voltage and the ground voltage. If all SG_SELj, sector select and operation signal are high the output of the elevator 902A is at positive voltage. In all other cases, the output is at ground voltage. The switching circuit 900A can only switch between positive voltage and zero voltage and thus cannot be used for a page erase instruction. Therefore, the driver switching circuit is modified as shown in FIG. 9B to include negative voltage.

Figure 9B:
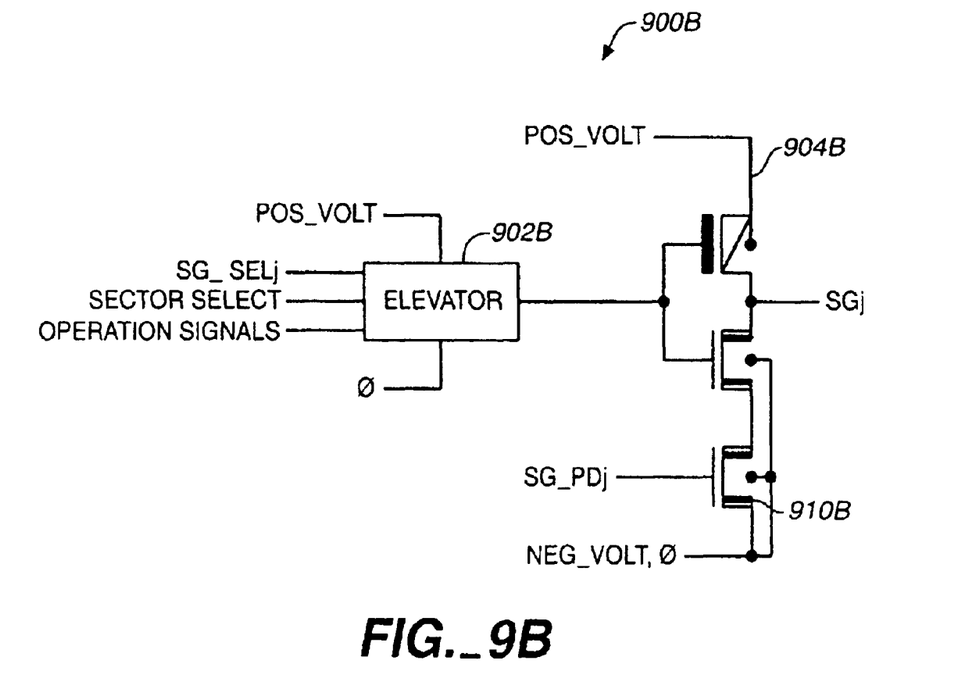
FIG. 9B is a schematic diagram of an improved driver switching circuit that selects a local decoder for use with the apparatus of FIG. 8A.

Referring to FIG. 9B, the driver switching circuit 900A can be improved by adding a NMOS transistor 910B to the source of the NMOS transistor 908B. The source of the NMOS transistor is tied to a negative and zero voltage so that the output SGj can be negative, zero, or positive voltages. The gate of the added NMOS transistor 910B is connected to the output SG_PDj of the global switch in the global driver.

Figure 10:
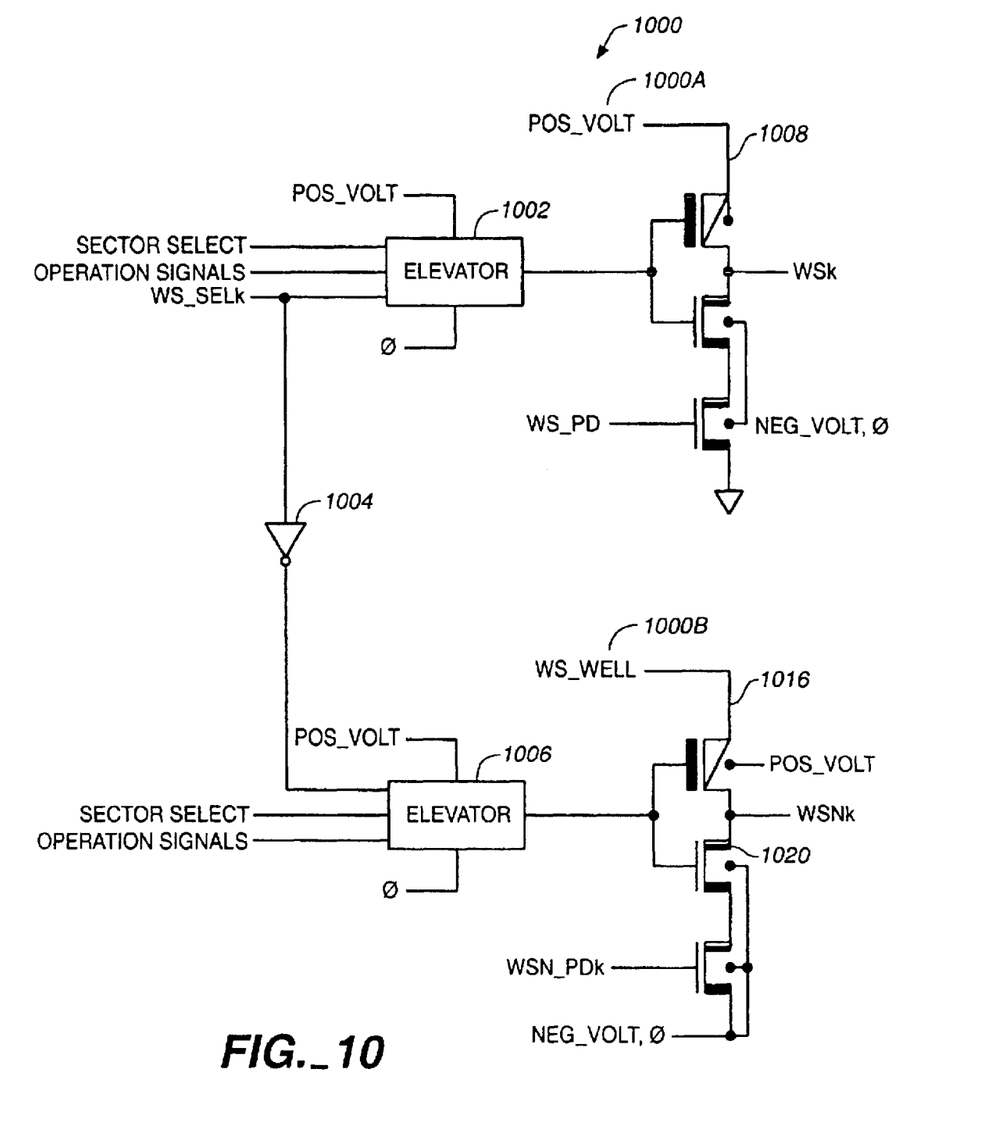
FIG. 10 is a schematic diagram of a wordline select driver for use with the apparatus of FIG. 8A.

Referring to FIG. 10, the wordline select driver 1000 comprises a first driver switching circuit 1000A and a second driver switching circuit 1000B. The first driver-switching circuit 1000A and the second driver switching circuit 1000B are similar to the circuit described in FIG. 9 above and they are connected by an inverter. The first driver switching circuit 1000A comprises an elevator circuit 1002, coupled to a CMOS inverter 1008 described in FIG. 9B above. But the source of the second NMOS transistor is coupled to an electrical ground. The gate of the second NMOS transistor is connected to the global signal WS_PD. The second driver switching circuit 1000B comprises a second elevator circuit 1006 coupled to a second CMOS inverter 1016. The gate of the second NMOS transistor is coupled to the global signal WSN_PD. The first elevator circuit 1002 and the second elevator circuit 1006 each have three input terminals, namely sector select, operation signal, and WS_SELk. Both elevator circuits are driven between a positive and a ground voltage. The WS_SELk terminals of the first and second elevator are coupled by an inverter 1004. So the second WS_SELk is complementary to the first WS_SELK. The output of the first switching circuit 1000A is coupled to the WSk terminal and the output of the second switching circuit 1000B is coupled to the WSNk terminal.

Figure 11:
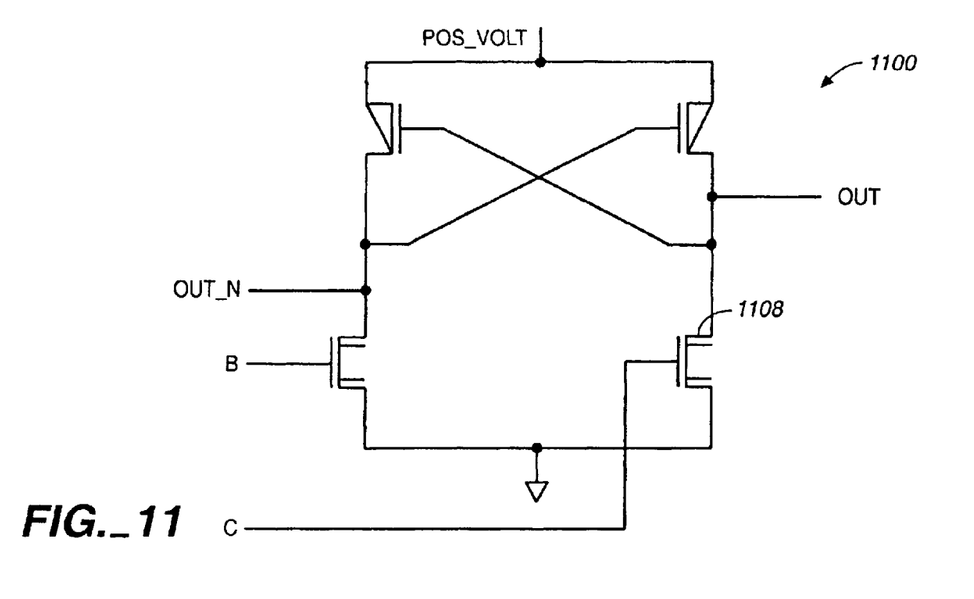
FIG. 11 is a schematic diagram of an elevator circuit for use with the apparatus of FIG. 8A.

In FIG. 11 an elevator circuit 1100, such as those used in FIG. 10, comprises four transistors. When input C is high and input B is low, the output OUT is pulled low to ground voltage because the NMOS transistor 1108 is ON. If input B is high and input C is low, the output OUT is pulled up to the positive voltage and the output OUT_N is pulled down to ground voltage.

Figure 12:
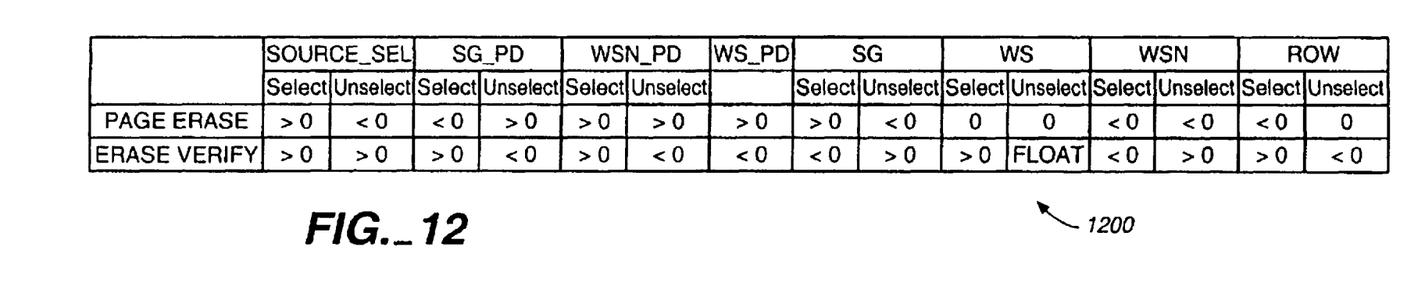
FIG. 12 is a table of signals applied to four different terminals of the global decoder of FIG. 8A, to three terminals of the local decoders and to the wordlines for carrying out a page erase and page erase verify according to the present invention.

Referring to FIG. 12, a table 1200 summarizes all bias conditions for the function terminals of the global decoder and the local decoders as discussed in detail in FIG. 3, FIG. 4, and FIG. 5. The conditions for page erase and verify summarized in table 1200 and the local decoder, local circuitry and global decoder arrangements as discussed above enable the memory array to achieve page erase, and erase verify without additional circuitry. Thus, the memory array according to the invention conserves area for use by memory cells. In addition, the arrangement enables the global decoder to provide non-changing voltage for the reading instructions. Thus, the reading time is not affected.

What is claimed is:

1. A flash memory array apparatus comprising:
   a memory array arranged in rows and columns and further partitioned into a plurality of sectors, wherein each sector comprises a plurality of groups and each group further comprises a plurality of rows;
   a plurality of local decoders, each coupled to each row of the memory array for passing a voltage corresponding to a specific instruction, wherein each local row decoder further comprises at least one NMOS transistors for passing negative voltage to the row of memory array and one PMOS transistor for passing positive voltage to the row of memory array;
   a local circuit coupled to the plurality of local decoders for passing the voltage thereto; and
   a global decoder coupled to the local circuit for passing the specific voltage thereto.

2. The flash memory array of claim 1, wherein each memory cell is a floating gate transistor having a control gate, a drain, and a source, the control gates of the floating gate transistors in the row are coupled together forming a wordline coupled to the plurality of local decoders, and the sources are coupled together, and the drains of the floating gate transistors are coupled together forming a bitline.

3. The flash memory array of claim 1, wherein the local circuit further comprises:
   a plurality of source selectors, wherein each source selector is coupled to the plurality of local row decoders and the global row decoder for providing the negative voltage to said plurality of local row decoders;
   a plurality of driver switching circuits coupled between the global decoder and the plurality of local row decoders for providing a voltage (SGj) to the plurality of local decoders; and
   a plurality of wordline select (WS) drivers coupled between the global decoder and the plurality of local row decoders for providing a set of voltages for the plurality of local row decoders.

4. The memory array of claim 3, wherein each source selector further comprises a PMOS transistor coupled in parallel with an NMOS transistor; gates of the PMOS and NMOS transistor being coupled together and to the local decoder, the source of the PMOS transistor being coupled to a local negative voltage supply, the source of the NMOS transistor is coupled to an electrical ground, the gates of the PMOS transistor and the NMOS transistor are coupled to the a global source selector.

5. The memory array of claim 3, wherein each driver switching circuit further comprises a first elevator circuit, coupled to a first CMOS buffer, wherein the elevator circuit is driven between a positive and a ground voltage.

6. The memory array of claim 5, wherein the CMOS buffer is an inverter further comprising a PMOS transistor coupled in series with a first NMOS transistor, and a second NMOS transistor, the drain of the PMOS transistor is coupled to a positive voltage, the gate being coupled to the gate of the first NMOS transistor, the source of the PMOS transistor being coupled to the drain of the first NMOS transistor, and the substrate of the first NMOS transistor being coupled to the substrate and the source of the second NMOS transistor, the source of the first NMOS transistor being coupled to the drain of the second NMOS transistor, and the gate of the second NMOS transistor being coupled to the global decoder.

7. The memory array of claim 3, wherein each wordline select driver further comprises a first driver switching circuit and a second driver switching circuit, wherein:
the first driver switching circuit comprises a second elevator circuit, coupled to a second CMOS inverter, wherein the second elevator circuit is driven between a positive and a ground voltage;
the second driver switching circuit comprises a third elevator circuit coupled to a third CMOS inverter, wherein the third elevator circuit is driven between a positive and a ground voltage; and
an inverter having an input and an output terminal; wherein the input terminal is coupled to the second elevator circuit and the output terminal is coupled to the third elevator circuit.

8. The memory array of claim 7, wherein the CMOS inverter further comprises a PMOS transistor coupled in series with a first NMOS transistor, and a second NMOS transistor, the drain of the PMOS transistor being coupled to a positive voltage, the gate being coupled to the gate of the first NMOS transistor, the source of the PMOS transistor being coupled to the drain of the first NMOS transistor, and the substrate of the NMOS transistor being coupled to the substrate and the source of the second NMOS transistor, the source of the first NMOS transistor being coupled to the drain of the second NMOS transistor, and the gate of the second NMOS transistor being coupled to the global decoder.

9. The memory array of claim 1, wherein the plurality of local decoders each comprises a PMOS transistor coupled in series with a first NMOS transistor, and a second NMOS transistor coupled in parallel with the first NMOS transistor; the gate of the PMOS transistor being coupled to the gate of the first NMOS transistor, the source of the PMOS transistor being coupled to the drain of the first NMOS transistor and the second NMOS transistor and to each wordline; the sources of the first and second NMOS transistors being coupled together and to the plurality of source detectors.

10. A flash memory apparatus comprising:
a memory array arranged in rows and columns and further partitioned into a plurality of sectors, wherein each sector comprises a plurality of groups and each group further comprises a plurality of rows;
a global decoder located outside of the sector and having a global source select (glob_src_selk) terminal, a wordline select (WS_PD) terminal, a second wordline select (WSN_PD) terminal, and a group select (SG_PD) terminal;
a plurality of local decoders, each coupled to each row of the memory array for passing a voltage corresponding to a specific operation, wherein each local row decoder further comprises:
i) a PMOS transistor coupled in series with a first NMOS transistor, and a second NMOS transistor coupled in parallel with the first NMOS transistor; the gate of the PMOS transistor being coupled to the gate of the first NMOS transistor, the source of the PMOS transistor being coupled to the drain of the first NMOS transistor, to the drain of the second NMOS transistor and to each row of the memory array, the sources of the first and second NMOS transistors being coupled together;
a local circuitry receiving signals from the global decoder and passing them to the plurality of the local decoders, wherein the local circuitry further comprises:
i) a plurality of source selector, each source selector comprises a second PMOS transistor coupled in parallel with a third NMOS transistor; the drains of the second PMOS transistor and the third NMOS transistor being coupled together and to the source of each of the local decoder, the source of the second PMOS transistor being coupled to a local negative voltage source, the source of the third NMOS transistor being coupled to an electrical ground, both gates of the third NMOS transistor and the second PMOS transistor being coupled to the global source select terminal (glob_src_selk) of the global decoder;
ii) a plurality of wordline select (WS) drivers, each comprising:
(A) a first elevator circuit driven between a positive and a ground voltage, and coupled to a first CMOS inverter comprising a third PMOS transistor coupled in series with a fourth NMOS transistor, and a fifth NMOS transistor, the drain of the third PMOS transistor being coupled to a positive voltage, the gate is coupled to the gate of the fourth NMOS transistor and to an output terminal of the first elevator circuit, the source of the third PMOS transistor being coupled to the drain of the fourth NMOS transistor, and the source of the fourth NMOS transistor being coupled to the drain of the fifth NMOS transistor, the source of the fifth NMOS transistor being coupled to the electrical ground, and the gate of the fifth NMOS transistor being coupled to the wordline select (WS_PD) of the global decoder;
(B) a second elevator circuit driven between the positive and the ground voltage and coupled to a second CMOS inverter comprising a fourth PMOS transistor coupled in series with a sixth NMOS transistor, and a seventh NMOS transistor, the drain of the fourth PMOS transistor being coupled to a positive voltage, the gate being coupled to the gate of the sixth NMOS transistor and to an output terminal of the second elevator circuit, the source of the fourth PMOS transistor being coupled to the drain of the sixth NMOS transistor, and the source of the sixth NMOS transistor being coupled to the drain of the seventh NMOS transistor, the source of the seventh NMOS transistor being coupled to a negative or ground voltage, and the gate of the seventh NMOS transistor being coupled to the second wordline select (WSN_PD) of the global decoder; and
(C) an inverter having first terminal and a second terminal, first terminal being coupled to an input of the first elevator circuit and the second terminal being coupled to an input of the second elevator circuit;
iii) a plurality of driver switching circuits, each further comprising a third elevator circuit driven between the positive and the ground voltage and coupled to a third CMOS inverter comprising a fifth PMOS transistor coupled in series with an eighth NMOS transistor, and a ninth NMOS transistor, the drain of the fifth PMOS transistor being coupled to a positive voltage, the gate being coupled to the gate of the eighth NMOS transistor and to an output terminal of the third elevator circuit, the source of the fifth PMOS transistor being coupled to the drain of the eighth NMOS transistor, and the source of the eighth NMOS transistor being coupled to the drain of the ninth NMOS transistor, the source of the ninth NMOS transistor being coupled to a negative or ground voltage, and the gate of the ninth NMOS transistor being coupled to the sector select (SG_PD) of the global decoder; and iv) a plurality of sector switches, each comprising a fourth elevator circuit driven between the positive voltage and the negative voltages and having two output terminals, the first output terminal coupled to a tenth NMOS transistor and a second terminal coupled to a gate of the eleventh NMOS transistor, wherein the drain of the tenth NMOS transistor being coupled to the local negative voltage, and the source of the tenth NMOS transistor being coupled to the local negative voltage source; the drain of the eleventh NMOS transistor being coupled to the local negative voltage source, and the source being coupled to the electrical ground.

11. The flash memory of claim 10, wherein the global decoder further comprises a plurality of global switches; each global switch comprises an elevator circuit coupled to a buffer circuit driven between the positive voltage and the negative voltage.

12. The flash memory of claim 11, wherein the buffer circuit comprises a first PMOS transistor, a second PMOS transistor, a first NMOS transistor, and a second NMOS transistor; the gate of the first PMOS transistor being coupled to the gate of the first NMOS transistor and to an output terminal of the elevator circuit, the source of the first PMOS transistor being coupled to the drain of the first NMOS transistor; the gate of the second PMOS transistor being coupled to the gate of the second NMOS transistor and to the source of the first PMOS transistor, the drain of the second PMOS transistor being coupled to the drain of the first PMOS transistor and to the positive voltage, the source of the second PMOS transistor being coupled to the drain of the second NMOS transistor forming one of the terminal of the global decoder, and the source of the first NMOS transistor being coupled to the source of the second NMOS transistor and to the negative voltage.

* * * * *

UNITED STATES PATENT AND TRADEMARK OFFICE
CERTIFICATE OF CORRECTION

PATENT NO. : 6,804,148 B2
DATED : October 12, 2004
INVENTOR(S) : Lorenzo Bedarida et al.

It is certified that error appears in the above-identified patent and that said Letters Patent is hereby corrected as shown below:

<u>Title page</u>,
Item [75], Inventors, "Fabio T Caser" should read -- Fabio Tassan Caser --.

Signed and Sealed this

Twenty-second Day of February, 2005

JON W. DUDAS
*Director of the United States Patent and Trademark Office*